(12) United States Patent
Li et al.

(10) Patent No.: US 8,508,391 B1
(45) Date of Patent: Aug. 13, 2013

(54) CODE WORD FORMATTER OF SHORTENED NON-BINARY LINEAR ERROR CORRECTION CODE

(75) Inventors: Shu Li, San Jose, CA (US); Panu Chaichanavong, Sunnyvale, CA (US); Jun Gao, San Jose, CA (US)

(73) Assignee: Marvell International Ltd (BM)

( * ) Notice: Subject to any disclaimer, the term of this patent is extended or adjusted under 35 U.S.C. 154(b) by 34 days.

(21) Appl. No.: 13/349,756

(22) Filed: Jan. 13, 2012

Related U.S. Application Data (60) Provisional application No. 61/434,335, filed on Jan. 19, 2011.

(51) Int. Cl.
*H03M 7/20* (2006.01)

(52) U.S. Cl.
USPC .................. 341/102; 341/51; 341/67; 341/94; 341/107

(58) Field of Classification Search
USPC .................. 341/51, 67, 94, 102, 103, 107
See application file for complete search history.

(56) References Cited

U.S. PATENT DOCUMENTS

| | | | | | |
|---|---|---|---|---|---|
| 4,276,544 | A | * | 6/1981 | Iinuma | 341/63 |
| 5,355,133 | A | * | 10/1994 | Shimpuku et al. | 341/58 |
| 6,043,765 | A | * | 3/2000 | Twardowski | 341/65 |
| 7,673,225 | B2 | * | 3/2010 | Jeong et al. | 714/800 |
| 7,930,622 | B2 | * | 4/2011 | Oh et al. | 714/801 |
| 7,992,066 | B2 | * | 8/2011 | Oh et al. | 714/752 |
| 8,051,363 | B1 | * | 11/2011 | Liu | 714/780 |
| 8,078,936 | B2 | * | 12/2011 | Yamagishi et al. | 714/755 |
| 2003/0210163 | A1 | * | 11/2003 | Yang | 341/67 |
| 2007/0101229 | A1 | * | 5/2007 | Niu et al. | 714/752 |
| 2010/0100790 | A1 | * | 4/2010 | Sutskover | 714/752 |

* cited by examiner

*Primary Examiner* — Linh Nguyen (57) ABSTRACT

Systems, methods, and other embodiments associated with an encoder. In one embodiment, a system includes an encoder having a code word generator and an appending logic. The code word generator is configured to generate code words based on input data and identify one or more short code words. A short code word has a length less than a length of a full code word. The appending logic is configured to append at least one dummy value to at least one of the short code words to convert the at least one short code word to a full code word. The encoder may further be configured to encode the converted full code word and store the converted full code word without the at least one dummy value in a storage medium.

20 Claims, 6 Drawing Sheets

CODE WORD FORMATTER OF SHORTENED NON-BINARY LINEAR ERROR CORRECTION CODE

CROSS REFERENCE TO RELATED APPLICATIONS

This present disclosure claims the benefit of U.S. provisional application Ser. No. 61/434,335 filed on Jan. 19, 2011, which is hereby wholly incorporated by reference.

BACKGROUND

The background description provided herein is for the purpose of generally presenting the context of the disclosure. Work of the presently named inventor(s), to the extent the work is described in this background section, as well as aspects of the description that may not otherwise qualify as prior art at the time of filing, are neither expressly nor impliedly admitted as prior art against the present disclosure.

In information theory, a noisy channel coding theorem establishes that for any given degree of noise contamination of a communication channel, it is possible to communicate discrete data, approximately error free, at a determinable maximum rate through the channel. The maximum rate of approximately error free transmission through the channel is expressed as a function of bandwidth and a signal-to-noise ratio (SNR). Furthermore, the noisy channel coding theorem describes the maximum possible efficiency of error correcting methods versus the levels of noise interference and data corruption.

A low density parity check (LDPC) code is a linear error correcting code designed to overcome noise. LDPC codes are associated with LDPC code words that are defined by a sparse parity-check matrix. This sparse parity-check matrix is often randomly generated, subject to scarcity constraints. LDPC code words have a fixed number of symbols that form a full code word. However, input data may have fewer symbols than a requisite number of symbols of a full code word. The requisite number of symbols may be based on the hard disk drive sector size. Accordingly, different models, series, and manufacturers may have numerous code words. Since the numerous code words are different, encoders and decoders must be compatible with various codes. Therefore, while the LDPC codes seek to overcome noise, using a requisite number of symbols and the overhead of maintaining numerous codes reduces the adaptability of LDPC codes for different storage mediums.

SUMMARY

In one embodiment, a system includes an encoder having a code word generator and an appending logic. The code word generator is configured to generate code words based on input data and identify one or more short code words. A short code word has a length less than a length of a full code word. The appending logic is configured to append at least one dummy value to at least one of the short code words to convert the at least one short code word to a full code word. The encoder may further be configured to encode the converted full code word and store the converted full code word without the at least one dummy value in a storage medium.

The system may also include an iterative decoder logic configured to decode data having a detector and a decoder. The detector is configured to generate code words from the retrieved data and to identify short code words. The decoder is configured to append dummy values to short code words to convert the short code words to full code words. The iterative decoder logic is further configured to decode the converted full code word to generate a decoded converted full code word, and transmit the decoded converted full code word without the dummy values.

In another embodiment, the detector may further be configured to pack the retrieved data into circulants. A circulant is a predetermined amount of data. The dummy values may be placed in the circulants when a circulant is not full of the retrieved data.

In one embodiment, the dummy values appended by the appending logic of the encoder may be the same as the dummy values appended by the decoder of the iterative decoding logic.

In another embodiment, a method includes generating code words from input data. Short code words may be identified from the generated code words. A short code word has a length less than the length of a full code word. At least one dummy value is appended to at least one of the short code words to convert the at least one short code word to a full code word. Parity symbols are computed for the converted full code word and added to the converted full code word. The method further includes encoding the converted full code word and storing the converted full code word without the at least one dummy value in a storage medium.

In another embodiment, the method further comprises packing the retrieved data into circulants, wherein a circulant is a predetermined amount of data. The decoding dummy values are placed in circulants when a circulant is not full of retrieved data. The method also includes masking the decoding dummy values.

In another embodiment, a system comprises an iterative decoder logic configured to decode data retrieved from the storage medium. The iterative decoder logic comprises a detector configured to generate code words from the retrieved data and to identify one or more short code words; and a decoder configured to append at least one dummy value to at least one short code word to convert the at least one short code word to a full code word, and to decode the converted full code word.

In another embodiment, the iterative decoder logic is configured to process a code word in a time allotted based on a number of symbols in the code word. The decoder is configured to append the at least one dummy value in available time slots based on the time allotted.

BRIEF DESCRIPTION OF THE DRAWINGS

The accompanying drawings, which are incorporated in and constitute apart of the specification, illustrate various systems, methods, and other embodiments of various aspects of the disclosure. In some embodiments one element may be designed as multiple elements, multiple elements may be designed as one element, an element shown as an internal component of another element may be implemented as an external component and vice versa, and so on. Furthermore, elements may not be drawn to scale.

DETAILED DESCRIPTION

Described herein are systems, methods, and other embodiments associated with linear error correcting (LEC) code shortening in a storage medium. In one embodiment, an LEC code may be a low density parity check code. Shortening is a technique to obtain codes of a shorter length and lower rate from a given LEC code by forming code words. Data received by an encoder is parsed into code words. Code words standardize input. However, the data received may not contain enough data to parse the data into equal size code words, resulting in short code words. A short code word is a generated code word having fewer symbols than a full code word. In one embodiment, dummy values are appended to short code words to convert the short code words to full words so that encoding may be completed despite hardware specifying a requisite length of code words. In one example, encoding includes calculating parity symbols for the converted full code word. In this manner, the generated code words can be processed without initially having the requisite number of symbols or storing numerous code words, thereby increasing the adaptability of the system.

Figure 1:
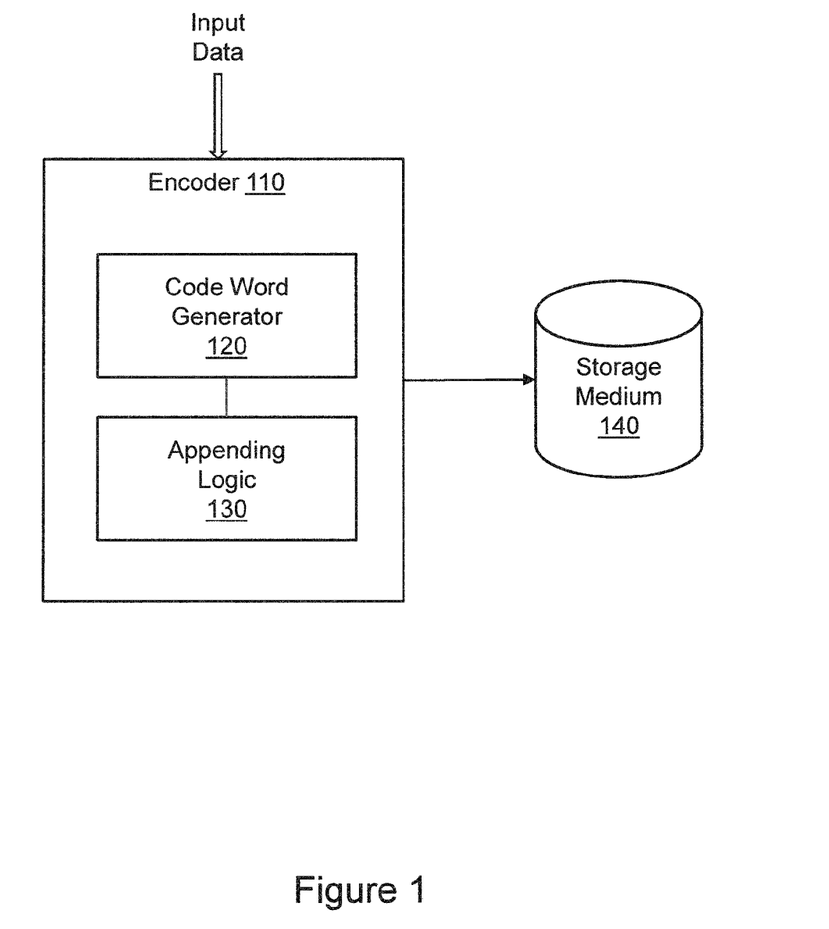
FIG. 1 illustrates one embodiment of a system associated with non-binary linear error correcting (LEC) code shortening in a storage medium.

With reference to FIG. 1, one embodiment of an encoder 110 is shown that encodes input data and performs at least a linear error correcting (LEC) function on the data. The encoder 110 is configured to encode the input data prior to storing the data in a storage medium 140. The storage medium 140 may be a hard disk, solid state disk device, or memory. In one embodiment, the encoder 110 includes a code word generator 120 and an appending logic 130. In some embodiments, the encoder 110 is part of a storage system within a computing device. The encoder 110 encodes the input data for one or more reasons (e.g., standardization, speed, secrecy, security, efficient storage) associated with storing the data within a device, such as the storage medium 140.

The code word generator 120 is configured to generate code words from the input data. In one embodiment, a generated code word is an element of standardized code. Code words may be generated according to specific rules. For example, a code word may be defined as having a predetermined length of symbols to be considered a full code word. The predetermined length may be based on the specifications (e.g., sector size) of the storage medium 140. However, the amount of input data received by the encoder 110 may not conform to the predetermined length. A code word generated by the code word generator 120 that does not have or meet the predetermined length of a full code word is referred to herein as a short code word.

After code words are generated from the input data, the code word generator 120 determines and identifies if any short code words are present. The code word generator 120 may determine that a generated code word is a short code word by subtracting the length of a generated code word from the length of full code word. The length of a full code word is predefined and thus known. In one example, the code word generator 120 subtracts the number of symbols of the generated code word from the number of symbols of full code word.

When a short code word is identified, the short code word is converted to a full code word. In one embodiment, the appending logic 130 appends one or more dummy values to the short code word to convert the short code word to a full code word. In other words, dummy values (e.g. filler symbols) are inserted into the short code word to create a word length equal to a full code word. In one embodiment, the dummy values appended by the appending logic 130 are non-binary. For example, the appending logic may append zero values to the short code words as the dummy values. Accordingly, the appending logic 130 generates full code words from the short code words by adding dummy values. In this manner, other components of the system that are configured to recognize and process only full code words are not affected by receiving short code words.

Once full code words are generated, error correction functions can be performed. For example, the encoder 110 is further configured to compute parity symbols from each full code word including the dummy values, if present, and add the parity symbols to the full code word. The converted full code word is then encoded (since the word now has the full size as expected by the encoder 110). The dummy values are removed from the converted code words prior to storing the code words, in one embodiment, to save storage space. Since the dummy values are not real values from the original code word, the dummy values are not needed. Thus in one embodiment, the encoded words are stored without the dummy values.

Figure 2:
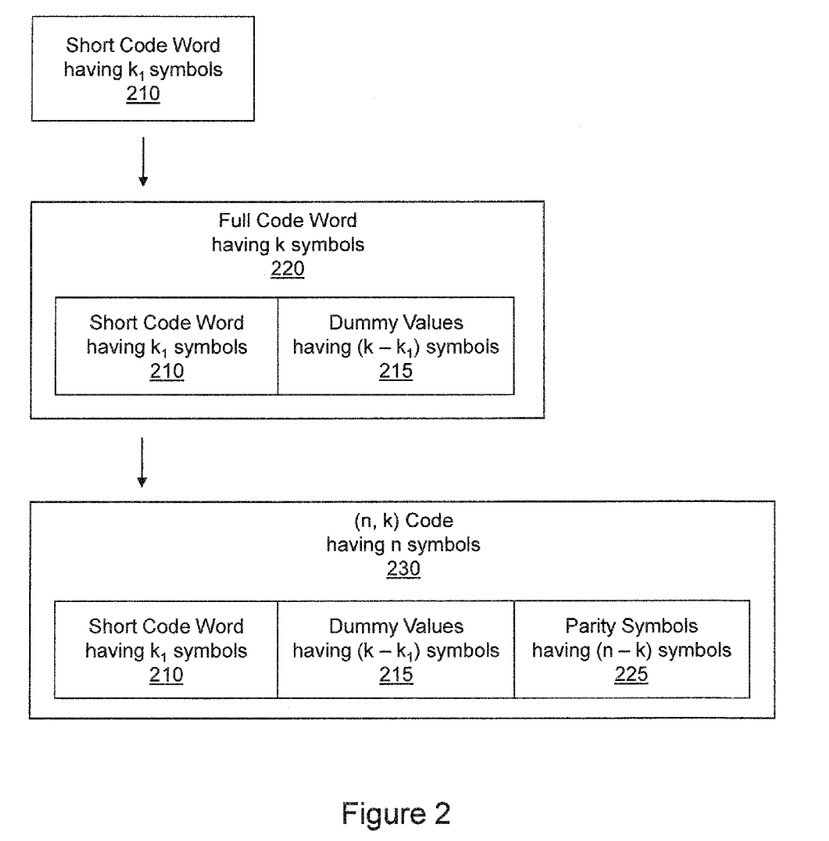
FIG. 2 illustrates one embodiment of non-binary code shortening of LEC codes in a storage medium.

FIG. 2 illustrates one embodiment of non-binary code shortening of LEC codes in a storage medium. As stated previously, a code word is an element of standardized code. The standardized code may be an (n,k) code associated with a low density parity check (LDPC) code that is parsed into code words. An (n,k) code is a code having n length and k length code words in its basis. As discussed with reference to FIG. 1, input data may sometimes be converted to a short code word 210 that has a variable number of symbols of input data, defined herein as $k_1$, which is less than the number of symbols of a full code word, defined herein as k.

To be correctly processed by the system, a full code word 220 having k symbols is desired. In one embodiment, the hardware components of an encoder/decoder are designed to process full code words. If a short code word is processed, inaccurate results may occur. A full code word 220 with k symbols has more symbols than a short code word 210 having $k_1$ symbols (e.g., k is greater than $k_1$). To increase the length of a short code word 210 to have k symbols, dummy values 215 are added/appended to the short code word 210 to generate a full code word 220. The added dummy values 215 having $k-k_1$ symbols combined with the short code word 210 having $k_1$ symbols thus equals k, the length of a full code word.

Converting the short code word 210 to the full code word 220 allows the system to process full code words as it expects to receive and allows error correction to be performed on full code words. In one embodiment, after the short code word 210 is converted to the full code word 220, parity symbols 225 are generated from the full code word 220 including the dummy values. The parity symbols 225 are added to the full code word 220. The parity symbols 225 are used as an error detecting code to perform a parity check during the decoding process. The combination of the short code word 210, dummy values 215, and parity symbols 225 yields the (n, k) code 230.

The (n, k) code 230 has a length n, which is equal to the combination of the parity symbols 225 given by (n–k), dummy values 215 given by (k−k₁), and the short code word 210 given by $k_b$ as shown in expression (1).

$$(n-k)+(k-k_1)+k_1=n \quad (1)$$

Thus, the final form of the (n, k) code 230, defined as an LDPC code having alength n, is generated from a short code word 210, dummy values 215, and parity symbols 225. While the example discusses LDPC codes, the embodiments discussed herein are applicable to other linear codes used as a linear error correcting code. Accordingly, while LDPC codes are used in the example for clarity and convenience, their usage is not intended to be limiting.

Figure 3:
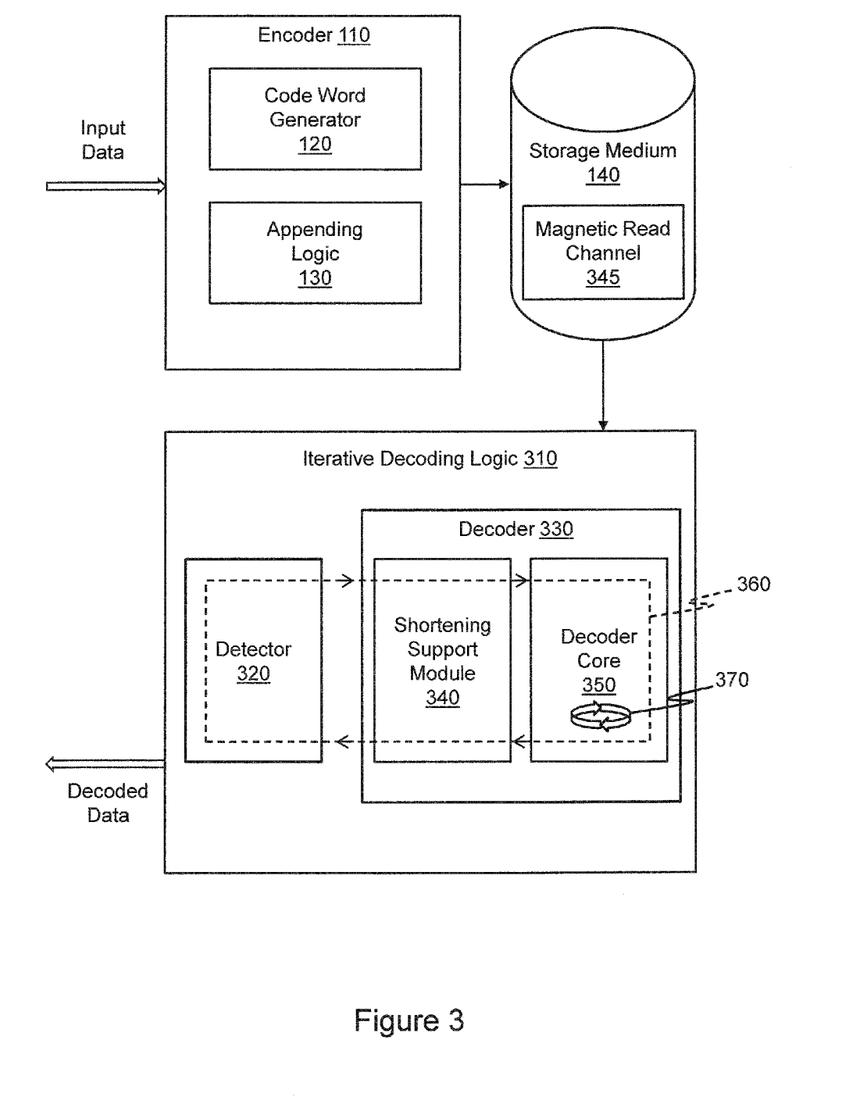
FIG. 3 illustrates one embodiment of a system associated with decoding non-binary LEC codes in a storage medium.

FIG. 3 illustrates one embodiment of a system associated with encoding and decoding non-binary LEC codes in a storage medium. The encoder 110 includes the code word generator 120 and appending logic 130, and functions in the manner described with respect to FIG. 1. The encoder 110 is configured to encode user input data and then store the encoded data in the storage medium 140.

When data is requested from the storage medium 140, the data (which is encoded) is retrieved and decoded before being outputted to the requester. To perform the decoding, the system includes an iterative decoding logic 310 that is configured to retrieve the encoded data from the storage medium 140 and decode the data. The iterative decoding logic 310 includes a detector 320 and a decoder 330. In one embodiment, the decoder 330 includes a shortening support module 340 and a decoder core 350. While the iterative decoding logic 310 retrieves encoded data from the storage medium 140, the retrieved data is observed by the detector 320. For example, detector 320 is configured to observe a magnetic channel 345 of the storage medium 140 to retrieve the data. Since some encoded code words were originally short code words as discussed above, those words will be short words when retrieved since the dummy values added during the encoding process were removed prior to storage. The detector 320 then generates short code words in the form of log-likelihood ratios (LLRs) from the retrieved data.

The shortening support module 340 handles LLR exchange between the detector 320 and the decoder 330. In one embodiment, the shortening support module 340 is a Soft Output Viterbi Algorithm—Low Density Parity Check (SOVA-LDPC) interface. The detector 320 identifies short code words and provides the short code words to the shortening support module 340. Full code words are excluded. The shortening support module 340 then appends dummy values to the short code words to generate full code words. In one embodiment, the dummy values appended during decoding are the same as the dummy values appended by the appending logic 130 during the encoding process.

Thus, the shortening support module 340 is configured to calculate dummy values in the same manner as the appending logic 130 (e.g., using the same algorithm, using the same predefined set of values, and so on). For example, the shortening support module 340 and the appending logic 130 may both be configured to append zero values as dummy values. Alternatively, the shortening support module 340 may use LLRs. Using LLRs may also causes zero values to be appended as dummy values so that the shortening support module 340 and the appending logic 130 apply equal dummy values.

The generated LLRs are transmitted from the detector 320, to the shortening support module 340, to the decoder core 350 in a global iteration 360. As seen in FIG. 3, the global iteration is represented as the dashed lines with arrows that form a circular path. In one embodiment, the global iteration 360 is a processing loop that is repeated between detector 320, the shortening support module 340 and the decoder core 350. The dummy values are appended by the shortening support module 340 in a first global iteration 360.

The number of global iterations 360 performed may be determined by the value output from the decoder 330 or the number of global iterations 360 may be predetermined. The decoder core 350 additionally has a local iteration 370. In the local iteration 370, the decoder core 350 acts to decode the LLRs. When the global iterations 360 are completed, the code words are decoded and the iterative decoding logic 310 outputs the decoded data.

Figure 4A:
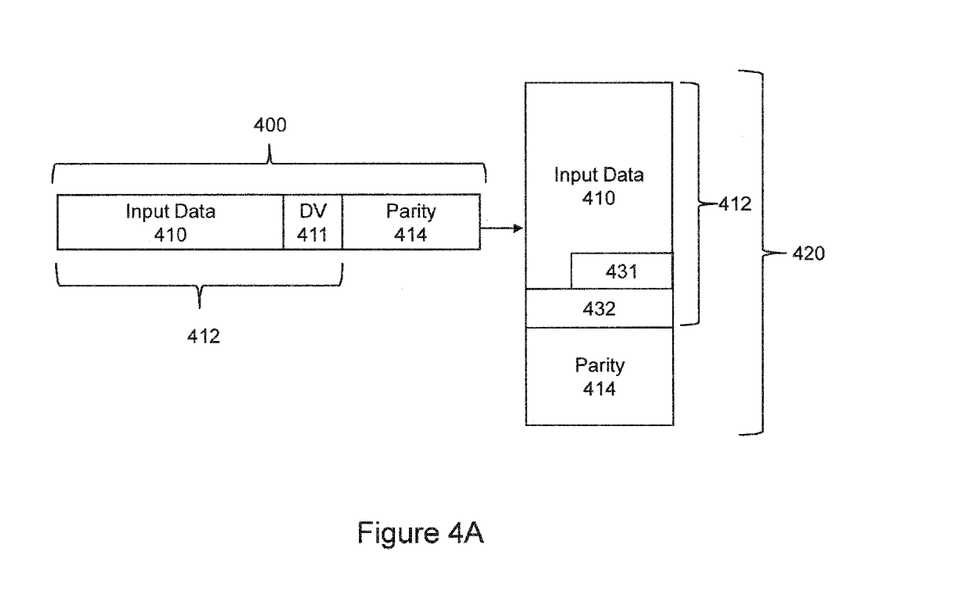
FIG. 4A illustrates one example of decoding non-binary LEC codes in a storage medium.

FIG. 4A illustrates one embodiment of decoding non-binary LEC codes in a storage medium. Consider that block 400 represents a code that includes input data 410 (e.g., a short code word), dummy values (DV) 411, and parity symbols 414. The input data 410 and dummy values 411 form a full code word 412. Parity symbols 414 are added to the full code word 412 to form the code 400. The code 400 corresponds to a block of code 420 that is to be stored in a memory of a decoder while the block of code 420 is being processed. The dummy values 411 are stored in a partial circulant 431 and a full circulant 432. Therefore, the input data 410, partial circulant 431, and the full circulant 432 form a full code word 412.

The basic unit of dummy values 411 is a circulant. A circulant may be a data packet that is configured to store a predetermined number of symbols. A circulant may be a n-by-n sub matrix (n×n) of a larger matrix containing symbols. In addition to the dummy values 411 being organized in circulants, the input data may also be organized in circulants. Dummy values 411 are appended to the input data 410 (short code word) based on the amount of input data 410 and the size of the circulant. The dummy values 411 may be placed in a partial circulant 431 or a full circulant 432. A partial circulant 431 stores input data 410 and dummy values 411. A full circulant 432 only stores dummy values 411.

For example, consider that input data 410 has 708 symbols. Suppose that a full code word has 360 symbols. Therefore, the input data 410 can be divided to generate two full code words having 354 symbols of input data. In this example, the input data is divided equally between the full code words so a first full code word is treated in the same manner as a second full code word, so an example of one full code word 412 will be given. The full code word 412 has 354 symbols of input data 410 and therefore six (6) symbols of dummy values 411 are appended to the full code word 412 to achieve the 360 symbol length.

Further suppose that a circulant may store four (4) dummy values 411. Accordingly, four dummy values of the six dummy values 411 are stored in a full circulant 432. The full circulant 432 carries only dummy values. The remaining two dummy values of the six dummy values 411 are stored in a partial circulant 431. The partial circulant 431 carries two dummy values and may also carry input data 410.

Figure 4B:
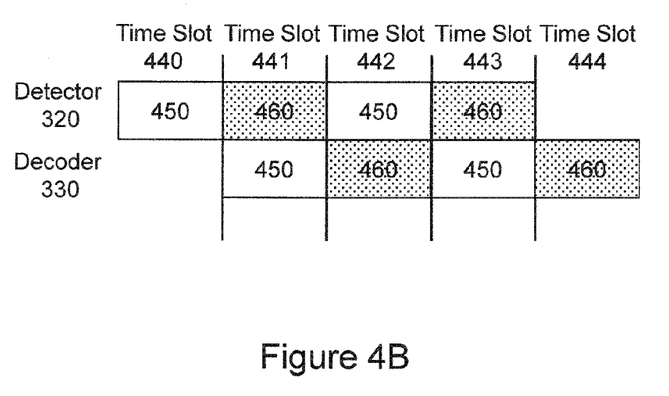
FIG. 4B illustrates one example of iterative decoding non-binary LEC codes in a storage medium.

FIG. 4B illustrates another embodiment of iterative decoding non-binary LEC codes in a storage medium. In this embodiment, an iterative decoder logic (as shown in FIG. 3) may not provide sufficient time to append dummy values to short code words. For example time allotted for processing a short code word may be based on the number of symbols the word has rather than the number of symbols desired for processing (e.g., a full code word). The fewer symbols a word has, the less time is allotted to decode the word because fewer symbols need to be decoded. This may improve processing time since short code words are processed in less time than full code words. Accordingly, the dummy values are appended in available time slots based on the time allotted.

This technique is described in FIG. 4B with illustrated time slots and with reference to the components of FIG. 3.

For example, the detector 320 detects a first code word 450 in a time slot 440. The detector may determine that the first code word 450 is a short code word but does not have enough processing time to append dummy values. The first code word 450 is sent to the decoder 330 in time slot 441 for dummy values to be added because time slot 441 is the first time the code word 450 has been to the decoder 330. Additionally the decoder is configured to update the input data. Meanwhile in time slot 441, the detector 320 is determining whether a second code word 460 is a short code word.

In time slot 442, the first code word 450 is returned to the detector 320. The detector 320 updates the input data and returns the first code word to the decoder 330 in time slot 443. Also in time slot 442, the decoder 330 has received the second code word 460 and may be adding dummy values, since time slot 442 is the first time the second code word 460 has been to the decoder 330. The first code word 450 and the second code word 460 may cycle between the detector 320 and the decoder 330 in time slots, such as time slot 443 and time slot 444, a predetermined number of times or until a certain value is achieved by the decoder 330.

The first code word 450 and the second code word 460 are being updated by the decoder 330. However, the dummy values added to the first code word 450 and the second code word 460 are maintained during the decoding so that the first code word 450 and the second code word 460 are processed correctly. In one embodiment, to maintain the dummy values, the dummy values may be subject to a masking function. The masking function identifies the location of dummy values so that the dummy values are not treated similarly as values carrying data. The masking function may selectively store dummy values to a specific location. Alternatively, the masking function may use an array to denote the bits in an address that the dummy values occupy so that the dummy values are not read out or written.

Figure 4C:
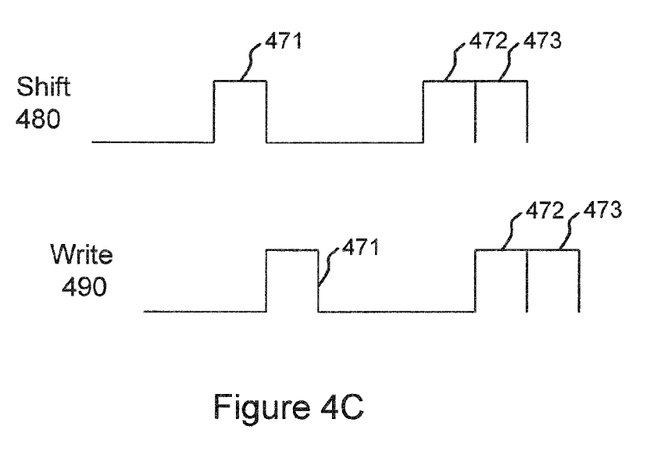
FIG. 4C illustrates one example of a timing diagram for writing non-binary code shortening of LEC codes in a memory.

FIG. 4C illustrates one example of a timing diagram for writing non-binary code shortening of LEC codes in a memory associated with the decoder. Specifically, the timing diagram illustrates data in a shift cycle 480 and a write cycle 490. The basic unit of shifting and writing of the input data and dummy values is a circulant. A decoder may be shifting and writing circulants cyclically as data is decoded because there is not processing time dedicated to appending dummy values as described in FIG. 4B.

In one embodiment, suppose the circulants have four symbols. A first circulant 471 may contain four symbols of input data and not need any dummy values. Therefore, the first circulant can be shifted in the shift cycle 480 and written in the write cycle 490. A second batch of input data may have five symbols. Therefore, the first four symbols of input data may be placed in a second circulant 472. The second circulant does not have dummy variables and is thus shifted in the shift cycle 480 and written in the write cycle 490. However, the remaining symbol of input data of the second batch of input data may not be written in the following cycle that is allocated for new input data. Therefore, a third circulant 473 is generated and written to directly follow the second circulant 472. The third circulant contains the remaining symbol of input data of the second batch of input data and three dummy values. In one embodiment, after the dummy values are added, the full code word is decoded and a parity check is performed. If the parity matches the parity symbols that were added during encoding, then decoding is successful. The parity symbols and dummy values are then removed from the code word and the decoding process continues with any remaining data.

Figure 5:
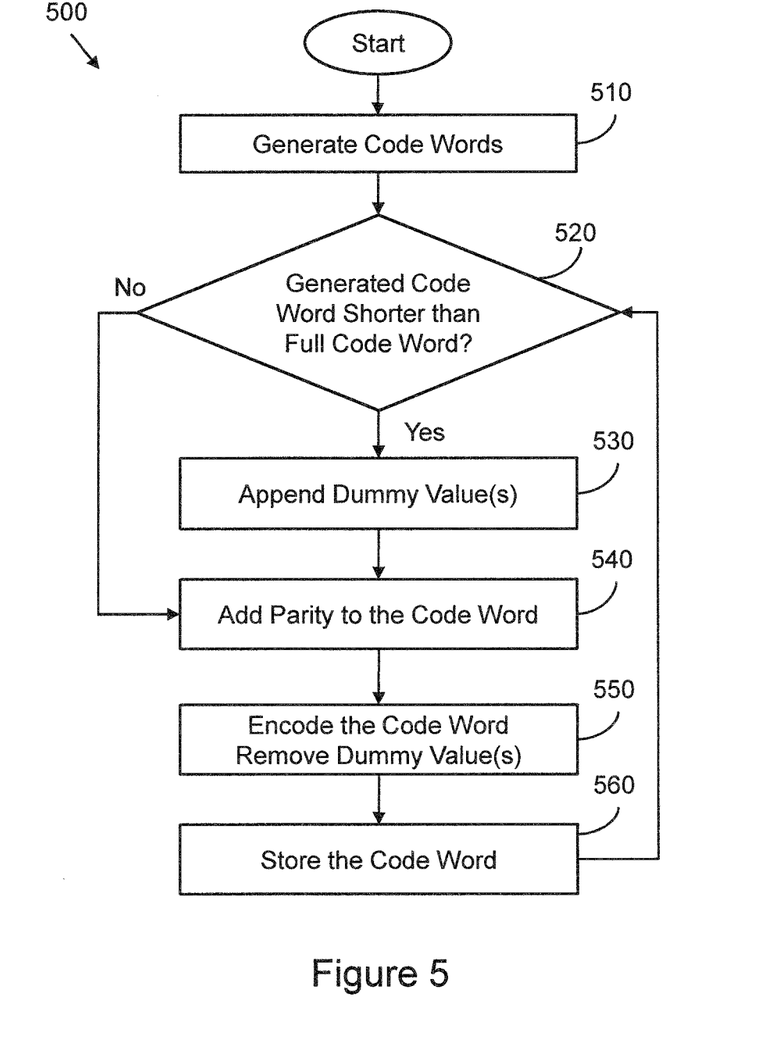
FIG. 5 illustrates one embodiment of a method for non-binary LEC code shortening in a storage medium.

FIG. 5 illustrates one embodiment of a method for shortening and encoding code words as described with reference to FIG. 1 or the embodiments of the other Figures. At 510, code words are generated from input data that is to be encoded. The input data may be code, textual data, application data, audio data, or video data. In other embodiments, other data formats may be encoded. At 520, the method identifies if one or more short code words were generated from the input data. As previously explained, a short code word has fewer symbols than a full code word. In one embodiment, short code words may be generated as LLRs log-likelihood ratios (LLRs).

For example, suppose a full code word contains 360 symbols. Suppose the input data includes 714 symbols. Therefore, the first 360 symbols of input data is placed in a first code word, and 354 symbols remain. Because the first code word contains the number of symbols of a full code word, the method moves to 540 where parity symbols are computed and added to the code word. At 550, the full code word is encoded. At 560, the encoded word is stored and the method continues with any remaining code words. For example, a second code word is generated from the remaining 354 symbols of the original 714 of input data. At 520, because the second code word does not contain the number of symbols of a full code word (e.g., 360 symbols), the second code word is identified as a short code word and the method moves to 530.

At 530, dummy values are appended to the short code word to convert the short code word to a full code word. In the example described above, the short code word has 354 symbols, which is six (6) symbols less than a full code word (e.g. 360–354). Therefore, at 530, six dummy values are added to the short code word so that the code word now has the same length as a full code word. At 540, parity symbols are computed using both the original data and the appended dummy values. The parity symbols are then added to the code word. At 550, the full code word is encoded but the dummy values are removed prior to storing the encoded word, as previously described. At 560, the encoded code words are stored in a data store and the method continues if there is more data to encode.

The systems, embodiments, and methods herein, add dummy values to data received that does not contain enough data to parse the data into requisite sized code words. Specifically, if a short code word is generated, dummy values are appended to convert the short code words to full words so that encoding may be completed despite hardware specifying the requisite length of code words. In this manner, input data may be encoded regardless of the amount of input data.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable medium", as used herein, refers to a non-transitory medium that stores instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Logic", as used herein, includes but is not limited to hardware, firmware, instructions stored on a non-transitory medium or in a machine, and/or combinations of each to perform a function(s) or an action(s), and/or to cause a function or action from another logic, method, and/or system. Logic may include a programmed microprocessor, a discrete logic (e.g., ASIC), an analog circuit, a digital circuit, a programmed logic device, a memory device containing instructions, and so on. Logic may include one or more gates, combinations of gates, or other circuit components. Where multiple logics are described, it may be possible to incorporate the multiple logics into one physical logic. Similarly, where a single logic is described, it may be possible to distribute that single logic between multiple physical logics. One or more of the components and functions described herein may be implemented using one or more of the logic elements.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

While for purposes of simplicity of explanation, illustrated methodologies are shown and described as a series of blocks. The methodologies are not limited by the order of the blocks as some blocks can occur in different orders and/or concurrently with other blocks from that shown and described. Moreover, less than all the illustrated blocks may be used to implement an example methodology. Blocks may be combined or separated into multiple components. Furthermore, additional and/or alternative methodologies can employ additional, not illustrated blocks.

To the extent that the term "includes" or "including" is employed in the detailed description or the claims, it is intended to be inclusive in a manner similar to the term "comprising" as that term is interpreted when employed as a transitional word in a claim.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the disclosure is not limited to the specific details, the representative apparatus, and illustrative examples shown and described. Thus, this application is intended to embrace alterations, modifications, and variations that fall within the scope of the appended claims.

What is claimed is:

1. A system, comprising:
   an encoder configured to encode input data, the encoder comprising:
   a code word generator configured to generate code words based, at least in part, on the input data, and identify one or more short code words, wherein a short code word has a length less than a length of a full code word; and
   an appending logic configured to append at least one dummy value to at least one of the short code words to convert the at least one short code word to a full code word;
   wherein the encoder is further configured to:
   encode the converted full code word; and
   store the converted full code word without the at least one dummy value in a storage medium.

2. The system of claim 1, further comprising:
   an iterative decoder logic configured to decode data from the storage medium, the iterative decoder logic comprising:
   a detector configured to generate code words from the retrieved data and to identify one or more short code words, and
   a decoder configured to:
   append at least one dummy value to at least one short code word to convert the at least one short code word to a full code word;
   decode the converted full code word to generate a decoded converted full code word; and
   transmit the decoded converted full code word without the at least one dummy value.

3. The system of claim 2, wherein the dummy values appended by the appending logic of the encoder are the same as the dummy values appended by the decoder of the iterative decoding logic.

4. The system of claim 2, wherein the detector is configured to pack the retrieved data into circulants, wherein a circulant is a predetermined amount of data, and wherein the detector is configured to place the dummy values in the circulants when a circulant is not full of the retrieved data.

5. The system of claim 4, wherein the detector is configured to place the dummy values in the circulants when the retrieved data is first encountered by the detector.

6. The system of claim 1, wherein the dummy values are nonbinary.

7. The system of claim 1, wherein the appending logic is configured to subtract a number of symbols of the short code word from a number of symbols representing the full code word to determine a number of dummy values to be appended to the short code word.

8. The system of claim 1, wherein the number of symbols in the full code word is based, at least part on, application data or storage medium specifications.

9. A method, comprising:
   generating code words from input data;
   identifying one or more short code words from the generated code words, wherein a short code word has a length less than the length of a full code word;
   appending at least one dummy value to at least one of the short code words to convert the at least one short code word to a full code word;
   computing parity symbols for the converted full code word and adding the parity symbols to the converted full code word;

encoding the converted full code word; and storing the converted full code word without the at least one dummy value in a storage medium.

10. The method of claim 9, further including performing a decoding process comprising:

retrieving data from the storage medium;

generating code words from the retrieved data;

identifying one or more short code words from the retrieved data;

appending at least one decoding dummy value to at least one of the short code words to convert the at least one short code words to a full code word;

decoding the full code word to generate a decoded converted full code word; and transmitting the decoded converted full code word without the at least one dummy value.

11. The method of claim 10, wherein the decoding dummy values are the same values as the dummy values appended prior to encoding.

12. The method of claim 9, wherein the decoding dummy values and the dummy values appended prior to encoding are zero values.

13. The method of claim 10, further comprising:

packing the retrieved data into circulants, wherein a circulant is a predetermined amount of data, and wherein the decoding dummy values are placed in circulants when a circulant is not full of retrieved data; and masking the decoding dummy values.

14. The method of claim 13, wherein the decoding dummy values are placed in the circulants when the retrieved data is first encountered by a detector.

15. A system, comprising:

an iterative decoder logic configured to decode data retrieved from the storage medium, the iterative decoder logic comprising:

a detector configured to generate code words from the retrieved data and to identify one or more short code words, and a decoder configured to append at least one dummy value to at least one short code word to convert the at least one short code word to a full code word, and to decode the converted full code word.

16. The system of claim 15, wherein the detector is configured to pack the retrieved data into circulants, wherein a circulant is a predetermined amount of retrieved data, and wherein the detector is configured to place the dummy values in the circulants when a circulant is not full of the retrieved data.

17. The system of claim 16, wherein a circulant containing a portion of the retrieved data and at least one dummy value is a partial circulant, and wherein a circulant having only dummy values is a full circulant.

18. The system of claim 16, wherein detector is configured to place the dummy values in the circulants when the retrieved data is first encountered by the detector.

19. The system of claim 17, wherein the detector is configured to mask the dummy values in a partial circulant and store the partial circulant in the decoder.

20. The system of claim 15, wherein the iterative decoder logic is configured to process a code word in a time allotted based on a number of symbols in the code word; and wherein the decoder is configured to append the at least one dummy value in available time slots based on the time allotted.

* * * * *